United States Patent [19]

Anazawa et al.

[11] 3,893,193

[45] July 1, 1975

[54] HERMETICALLY HOUSED ELECTRICAL COMPONENT DEVICE

[75] Inventors: Shinzo Anazawa; Seiichi Ueno; Isamu Nagasako, all of Tokyo, Japan

[73] Assignee: Nippon Electric Company, Limited, Tokyo, Japan

[22] Filed: Feb. 21, 1974

[21] Appl. No.: 444,347

[30] Foreign Application Priority Data

Feb. 22, 1973 Japan ................................ 48-21864

[52] U.S. Cl. ................. 333/84 M; 174/52 S; 357/80

[51] Int. Cl.²... H01L 23/02; H01L 23/32; H01P 1/00

[58] Field of Search ............ 333/84 M; 317/101 CP; 174/52 S, 52 PE, DIG. 3; 357/74, 80

[56] References Cited

UNITED STATES PATENTS

| | | | |
|---|---|---|---|
| 3,502,786 | 3/1970 | Stoll | 174/DIG. 3 |
| 3,651,434 | 3/1972 | McGrough et al. | 333/84 M |
| 3,801,938 | 4/1974 | Goshgarian | 333/84 M |

*Primary Examiner*—Paul L. Gensler
*Attorney, Agent, or Firm*—John M. Calimafde

[57] ABSTRACT

A hermetically sealed device includes a ceramic substrate having a pattern of first metallized layers formed on one of its major surfaces. Each of the first metallized layers of the pattern includes a bonding region and an external lead connection region. A uniform second metallized layer which serves as a ground conductor is formed on the other side of the substrate. An electronic component is bonded to the bonding region of one of the first metallized layers and electrodes of the component are connected to the bonding regions of others of the first metallized layers. A first ceramic member having a central aperture and peripheral slots is mounted on the substrate so that it surrounds the component intersecting each of the first metallized layers between the bonding region and the external lead connecting region. External leads are brazed to each of the first metallized layers in the lead connecting regions. A second ceramic member has a central aperture and a third metallized layer formed on one of its surfaces. This second ceramic member is mounted on the first ceramic member so that the third metallized layer is disposed above the external lead connecting regions of the first metallized layers and so that the central apertures of the ceramic members are substantially aligned. A cover is biased to the second ceramic member to seal the device.

6 Claims, 7 Drawing Figures

HERMETICALLY HOUSED ELECTRICAL COMPONENT DEVICE

BACKGROUND OF THE INVENTION

This invention relates generally to hermetically housed electrical component devices and more particularly to mounting structures for hermetically sealed semiconductor devices for use in the ultra high frequency band.

The hermetically housed assembly for a conventional electrical component of this kind comprises a ceramic substrate provided with a metallic layer over the entire bottom surface thereof to act as a ground conductor, and a metallic layer on the upper surface on which at least one an electrical component is mounted. An annular disk-shaped ceramic layer is disposed above the ceramic substrate. A metallized layer is provided on the upper surface of this ceramic layer. Binding material such as glass is interposed between the substrate and the ceramic layer. A plurality of metallic leads for external connections are inbedded in the binding material. Metallic wires are connected between the electrodes of the electrical component mounted on the ceramic substrate and the external leads. A metallic lid is soldered to the ceramic layer for hermetically encasing the electrical component. With this hermetically sealed housing structure for an electrical component, the impedance at the junction between the external leads and the ceramic substrate can be made matched to the external circuit to a certain extent by varying the thickness of the ceramic layer, for instance. Since, however, the external leads are rigidly mounted within a dielectric binding material such as glass in this conventional structure, the glass binding material will tend to crack when severe mechanical or thermal shocks are applied to the external leads. Cracks in the glass binding material degrade the hermetic seal and the reliability of the electrical component mounted within the structure.

Accordingly, it is an object of the present invention to provide a hermetically housed electrical component device which overcomes the afore-mentioned defects of the prior art and has an increased mechanical strength at the junction of the external leads and the ceramic substrate and to provide such a device in which the external circuit can be easily impedance matched with the junction of the external lead assembly and the ceramic substrate.

SUMMARY OF THE INVENTION

An electrical component device includes a ceramic substrate in which a first major surface is covered with a metallized layer serving as a grounding conductor, and a second major surface has a plurality of first metallized layers formed thereon each of said first metallized layers having an external lead connecting region and a bonding region. External leads are brazed or soldered onto the external lead connecting regions of the first metallized layers. A first ceramic member having a central aperture is mounted so as to substantially enclose an electrical component which is disposed on the ceramic substrate, and so that the first ceramic member intersects each of the first metalizing layers between the external lead connecting region and the bonding region. Both the first ceramic member and the external lead connecting regions of the first metallized layers are then covered by a second ceramic member. A third metallized layer is formed on at least one major surface of the second ceramic member so that the third metallized layer is above the external lead connecting regions of the first metallized layers.

The strip transmission line structure adopted by this invention which includes the pattern of first metallized layers formed on the substrate, can contribute greatly to stabilizing and improving the transmission characteristic of the device. The brazed connection of the external leads onto the first metallized layers helps increase the bonding strength at the junction of the external leads and the substrate. Further, brazing material or solder cannot flow into the bonding regions of the first metallized layers during the brazing or soldering of the external leads onto the external lead connecting regions of the first metallized layers because of the presence of the first ceramic member. Since at least one major surface of the second ceramic member includes a metallized layer which extends over the external leads connecting regions of the first metallized layers on the substrate, the external lead connecting regions can be easily impedance-matched to an external circuit by varying the thicknesses of the first ceramic member and the second ceramic member. Such a device of extreme structural compactness is highly advantageous for applications in the ultra-high-frequency band.

The second ceramic member is bonded, at least at the inner portion of the bottom surface thereof, to the upper surface of the first ceramic member by a dielectric binding agent such as glass or a metallized layer and solder. On the other hand, the outer portion of the bottom surface of the second ceramic member may be, partly or wholly, bonded to the external leads and to the external lead connection regions of the first metallized layers by a dielectric binding agent such as glass, or if desired a suitable clearance may be left between the second ceramic member and the external leads. The configuration of the second ceramic member may be modified such that the outer portion of its bottom surface projects downward so as to make contact with the external leads and the external lead connection regions of the first metallized layers directly or through a binding agent. A metallized layer can be provided on the top surface of the second ceramic member, and preferably on the outer portion of the top surface, so that a metallic cover or lid can be bonded with this metallized layer.

DESCRIPTION OF THE DRAWINGS

Now the present invention will be described more in detail by reference to the accompanying drawings in which similar structures are designated by the same reference number, wherein.

DESCRIPTION OF THE INVENTION

Figure 1:
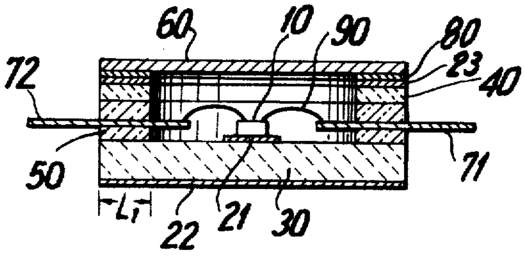
(PRIOR ART) FIG.1
FIG. 1 is a cross sectional view of a conventional hermetically housed electrical component device.

Referring now to FIG. 1, there is shown a conventional semiconductor device structure comprising a ceramic substrate 30. The entire lower surface of the substrate 30 is covered with a metallized layer 22 (tungsten, for example) which serves as a ground conductor. The upper surface of the substrate 30 is partly covered with a metallized layer 21 for mounting thereon a semiconductor element 10. A ceramic layer 40 is disposed above the substrate 30 and is spaced from the substrate 30 by a layer of sealing material 50. The upper surface of the ceramic layer 40 is covered with a metallized layer 23. External leads 71, 72 and a third lead which is unillustrated, are disposed between the substrate 30 and the ceramic layer 40 by partly sealing these leads in the sealing medium 50 which may be glass, for example. Fine wires 90, which may for example be made of gold, connect the electrical contacts of the semiconductor element 10 to the external leads 71, 72, and the third unillustrated lead. A metallic lid 60 is bonded to the metallized layer 23 on the ceramic layer 40 by a layer of brazing material 80, such as Ag-Cu alloy, so that the above described housing members form a hermetic housing for the semiconductor element 10. A housing structure of this type has the drawback that the glass seal 50 tends to be cracked by mechanical or thermal shocks which may be applied to the external leads 71 and 72, since portions of these leads are sealed in the glass material 50. There is an additional difficulty arising from the need for controlling the dimensions of the glass seal 50 and other elements of the housing to provide for impedance matching between the sealed section designated L1 in FIG. 1 of the external leads 72 and 73 and the external circuit to which leads are connected. In order to minimize the impedance mismatched portion of the external leads, it has been common practice to make the enclosure size as small as possible. This gives rise to a problem of reliability as a result of need for a complicated, fabrication technique requiring skilled personnel. Since the substrate 30 is not arranged in the strip line form and since the peripheral portions of the leads 71 and 72 within the housing are sealed in glass 50, the performance characteristics of the device are usually degraded and there arises a particularly serious problem when the device is operated in the ultra-high-frequency band. The housing structure illustrated in FIG. 1 may be said to be inappropriate for use in the ultra-high-frequency band when constructed as an extremely compact enclosure.

Figure 2:
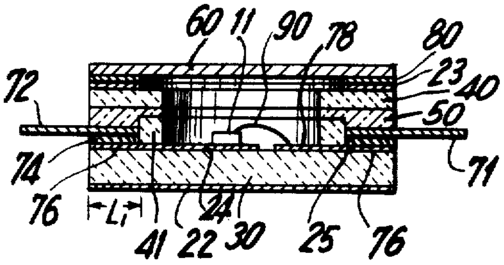
FIG. 2 is a cross sectional view of a hermetically housed electrical component device according to a first embodiment of this invention.
Figure 3:
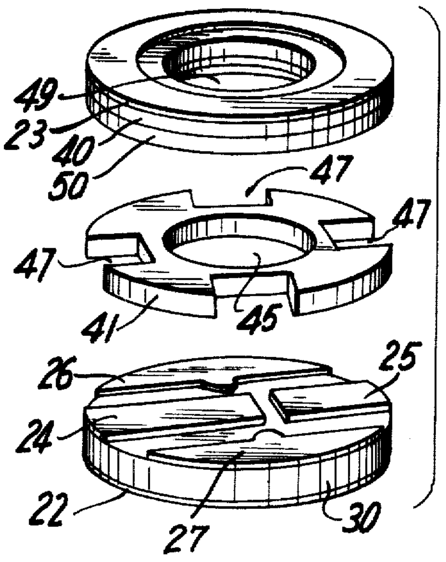
FIG. 3 is an exploded view depicting the construction of a part of the device shown in FIG. 2.

FIG. 2 illustrates an embodiment of a mounting enclosure for an ultra-high-frequency transistor of the double-emitter, grounded collector type. With a device of this type a pattern of metallized layers, such as 24, 25, 26 and 27 as seen in FIG. 3, are formed on a major surface of a ceramic substrate 30. A semiconductor element 11 is brazed by use of a brazing material such as Ag-Cu alloy onto one of the pattern of metallized layers 24. A ground conductor 22 consisting of a metallized layer is formed on the opposite surface of the substrate 30. A ceramic wall member 41 is provided surrounding the semiconductor element 11. This wall member 41 is mounted so that it intersects each of the metallized layers on the upper surface of the substrate. The area of intersection is between the external lead connection region 74 and the region 78 in which the semiconductor element is mounted on the metallized layer 24 and between the external lead connection region and the bonding region of each of the other metallized layers such as 25, 26 and 27. One end of each of the external leads 71 and 72 are brazed onto the connecting regions of the metallized layers 24 and 25. A fine metallic wire 90 is connected between the semiconductor element electrodes and the bonding regions of the other metallized layers 25, 26 and 27. A ceramic member 40 is disposed so as to cover the top surface of the ceramic wall member 41 and the top surface of the layer of sealing medium 50 which is disposed over the external lead connecting regions such as 74. The upper surface of the member 40 is covered with a metallized layer 23 over an area corresponding to the width $L_1$ of the external lead connecting region 74. A top cover member 60 which may, for example, be made of an alloy of iron, nickel, and cobalt, called Kovar, for hermetically housing the semiconductor element 11 is brazed onto the metallized layer 23 by a layer of brazing material 80. The ceramic member 40, the external lead connecting regions 74, and the ceramic wall member 41 are binded together by a glass seal 50. Since the metallized layers 24 and 25, corresponding to signal conductors, constitute a strip line structure together with the metallized layer 22 which acts as a grounding conductor, the transmission characteristic of this mounting structure can be stabilized and improved, as compared with the conventional structure shown in FIG. 1. Another refinement of the improved structure shown in FIG. 2 is that the external leads 71 and 72 are brazed onto the respective external lead connecting regions of the layers 24, 25, 26 and 27. This provides an increase in the strength of the bond between the external leads and the housing to provide durability against mechanical or thermal shocks applied to the leads. Still another refinement of this structure is that the ceramic wall member 41 is interposed between the bonding regions and the external lead connecting regions of the metallized layers 24, 25, 26 and 27. This helps to prevent brazing material from flowing into the bonding region during the brazing of the external leads to the external lead connecting regions thereby increasing the hermetic seal reliability of the device. A further structural refinement resides in the fact that the ceramic member 40 covers both the ceramic wall member 41 and the external lead connecting regions such as 74 and that the metallized layer 23 on member 40 is equal in width to the width $L_1$ of the external lead connecting region beneath it. This feature permits the impedance of the external lead connecting region to be more easily impedance matched to the external circuit. The impedance of this external lead connecting region may be adjusted by varying the thickness of the ceramic members 40 and/or 41, for instance.

Now, the sequence of fabrication steps involved in the manufacture of the device shown in FIG. 2 will be described by reference to FIG. 3. A ceramic substrate 30 is formed of an unsintered alumina ceramic tape. One major surface of the substrate 30 is partly covered with a metallization paste which may for instance be tungsten. This metallized layer forms a pattern of conductors such as 24, 25, 26, and 27. The opposite surface 22 of of the substrate 30 is entirely covered with the same metallization paste. A wall member 41 includes a central aperture 45 and is made of the same unsintered alumina ceramic tape. Peripheral notches 47 are provided in member 41 in positions corresponding to the external lead connecting regions of metallized layers 24, 25, 26 and 27. The wall member 41 and the substrate 30 are attached together with pressure so that the metallized pattern configuration on the ceramic substrate 30 and the notched portions of the wall member 41 are properly aligned and superposed upon each other. This subassembly is then sintered to form a unified structure in a wet hydrogen atmosphere at about 1,600°C. Then, nickel plating and sintering are carried out for the metallized surface. Thereafter, the external leads 71 and 72, which are made of a material such as Kovar, are brazed onto the metallized surface portions lying beneath the notches — 47 of wall member 41 in the external lead connecting regions. A layer of glass 50 is then formed on the bottom surface of the ceramic member 40. The top surface of member 40 is then metallized to form a metallized layer 23 of material such as of tungsten. The ceramic member 40 having a central aperture 49 is concentrically stacked on the wall member 41. Glass powder is then introduced into the notches in the wall member 41, and the members 40 and 41 are hermetically sealed together by molten glass 50 in a nitrogen gas atmosphere at a temperature of about 750°C. The height dimensions of the two members 40 and 41 must be predetermined for precise impedance-matching with the impedance of an external circuit. A semiconductor element 11 as shown in FIG. 2 is subsequently introduced into the subassembled closure and the entire bottom electrode surface corresponding to the collector of the element 11 is bonded to the metallized layer 24 in the bonding region. Then fine metallic wires 90 are respectively connected between the base electrode on the upper surface of the semiconductor element 11 and a bonding region of the metallized layer 25 and between the emitter electrode of semiconductor element 11 and the bonding regions of the metallized layers 26 and 27. An ultra-high frequency semiconductor device of extreme structural compactness and improved reliability is then completed by hermetically sealing the semiconductor element 11 with a cover member 60 shown in FIG. 2 as the final fabrication step.

Figure 4:
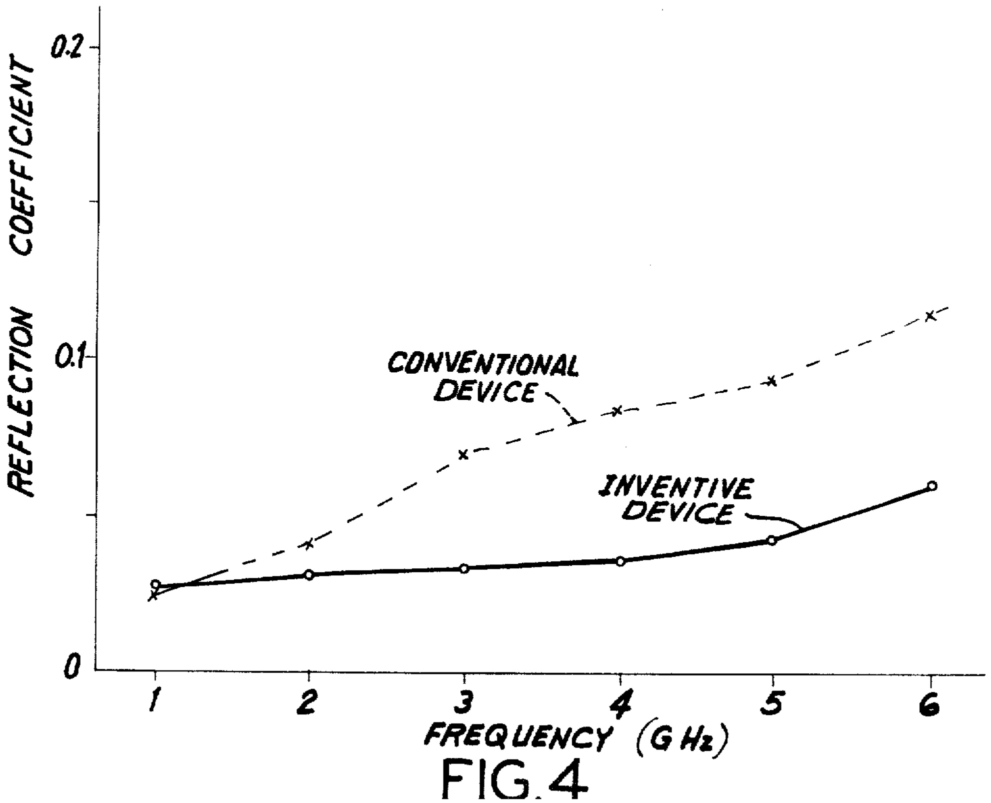
FIG. 4 is a graph depicting the variation of the reflection coefficient as a function of applied frequency for a conventional encasing structure and that improved by this invention.

FIG. 4 shows a plot of the reflection coefficient as a function of frequency for an ultra-high frequency semiconductor device made according to this invention as shown in FIG. 2 and for a conventional device as shown in FIG. 1. This experimental data demonstrates that the high-frequency characteristic of the device of this invention as shown by the solid-line curve of FIG. 4 is appreciably improved over the high-frequency characteristic of a conventional device shown by the dotted line curve.

The measured values upon which FIG. 4 was based were taken from the semiconductor devices in which the semiconductor elements 10 and 11 were replaced by a 50-ohm terminating resistor and the measurement was made using a network analyzer model HP-8540A made by Hewlett Packerd Co. The dimensions of the enclosures were tested and their component parts were approximately equal as set forth below.

The external dimensions of the enclosures tested were both approximately 3.5 mm in diameter and 1.3 mm in height. The thickness of ceramic substrates 30 was 0.55 mm. The thickness and width of the wall members 41 at the notch portion were 0.38 mm and 0.4 mm, respectively. The thickness and width of the ceramic members 40 were 0.25 mm and 1.1 mm, respectively. The thickness and width of the external leads 71 and 72 were 0.1 mm and 0.6 mm, respectively. The thickness of the metallized layers 22, 23, and 24 were approximately 10 microns.

Figure 5:
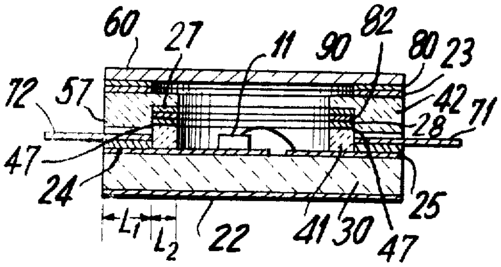
FIGS. 5 and 6 are cross sectional views of electrical component devices according to other embodiments of this invention.

Another embodiment of this invention is shown in FIG. 5, and close inspection of the device structure shown in FIG. 5 will reveal structural differences from the device shown in FIG. 2 as will be detailed below.

The metallized layers 28 and 27 are respectively provided in this structure. The metallized layer 28 covers the upper surface of the ceramic wall member 41 and the layer 27 is on the inner side of the bottom surface of the ceramic member 42. Layers 27 and 28 are joined together by a layer of binding material 82 such as a solder. A downwardly extending projection 57 is also provided on the outer side of the bottom surface of the ceramic member 42 so that member 42 can be fitted into the notches 47 cut in the wall member 41. With this structural modification, it has been found that not only can the equivalent effect of the device of FIG. 2 can be secured, but also that both the external lead connecting region $L_1$ and the section designated $L_2$ in FIG. 5 having the width of the wall member 41 can participate in impedance matching the device with the external circuit. This impedance matching is provided by controlling the dimensions of the downwardly extending projection 57 of the member 42 and the thicknesses of the members 41 and 42. An additional advantage of the structure shown in FIG. 5 is a further reduction of the value of the reflection coefficient.

Figure 6:
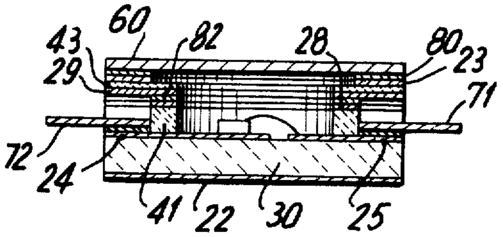

FIG. 6 is still another embodiment of this invention with another structural modification. In this embodiment, a metallized layer 28 is provided on the top surface of the ceramic wall member 41. The entire bottom surface of the ceramic member 43 is coated with a metallized layer 29 of uniform thickness. The metallized layers 28 and 29 are joined together by a layer of brazing or soldering material 82. This device provides an effect equivalent to that obtained from the device of FIG. 2.

Figure 7:
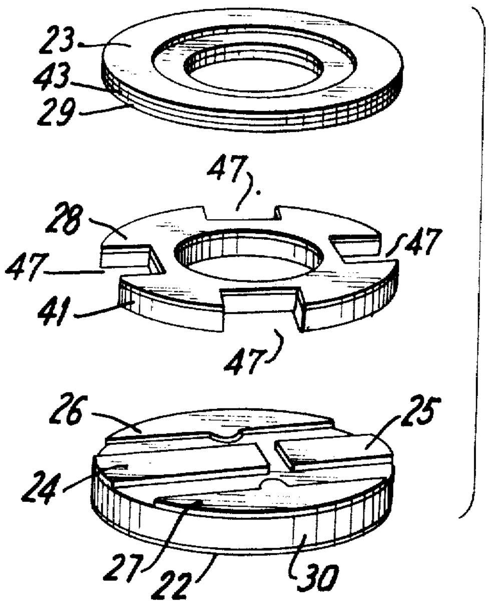
FIG. 7 is an exploded view depicting the construction of a part of the device shown in FIG. 6.

FIG. 7 is an exploded view of a part of the device structure shown in FIG. 6. The manufacturing steps of the device shown in FIG. 6 are largely the same as those described with reference to FIG. 3. A major difference in the manufacturing method of the device shown in FIG. 6 and 7 being that the members 41 and 43 are bonded together by a brazing material and there is a gap between the under side of the outer portion of ceramic member 43 and the external lead connecting regions.

Although several encasing structures of improved performance and reliability for use in the ultra-high-frequency band according to embodiments of this invention have been described above, it is to be clearly understood that the present invention should not be construed as being applicable to semiconductor elements only. Enclosing structures of this type should also find application with other types of electrical components such as thin-film integrated circuits, thin-film resistors, and the like.

What is claimed is:

1. An electrical component device including a ceramic substrate having a first and a second major surface;

a plurality of first metallized layers formed on said first major surface of said substrate, each of said first metallized layers including a bonding region and an external lead connecting region;

a second metallized layer formed on said second major surface of said substrate;

at least one electrical component mounted adjacent to said first major surface of said substrate, said electrical component having electrodes;

means for electrically connecting said electrodes of said electrical component to said bonding regions of said first metallized layers;

a first ceramic member having a first and a second surface and a central aperture, said first surface of first ceramic member being disposed on said first major surface of said substrate so that said first ceramic member intersects each of said first metallized layers between said bonding region and said external lead connecting region;

a number of external connecting leads, means for connecting said external connecting leads to said external lead connecting regions of said first metallized layers;

a second ceramic member;

a third metallized layer, said third metallized layer being formed on a first surface of said ceramic member;

means for attaching said second ceramic member to said first ceramic member so that said third metallized layer is mounted above said external lead connecting regions of said first metallized layers; and cover means attached to said second ceramic member.

2. A device as claimed in claim 1 in which said electrical component is bonded to the bonding region of one of said first metallized layers.

3. A device as claimed in claim 1 in which said first ceramic member has a plurality of peripheral slots, said first ceramic member being mounted on said substrate so that said external lead connecting regions of each of said first metallized layers are exposed through said slots and wherein said means for attaching said first ceramic member to said second ceramic member includes a glass member disposed between said first and second ceramic members, said glass member extending into said slots in said first ceramic member.

4. A device, as claimed in claim 1 including:

a fourth metallized layer, said fourth metallized layer being formed on said second surface of said first ceramic member;

a fifth metallized layer, said fifth metallized layer being formed on a second surface of said second ceramic member; and said second ceramic member being attached to said first ceramic member so that at least a portion of said fifth metallized layer is arranged above said fourth metallized layer.

5. A device as claimed in claim 4 in which said second ceramic member has a central aperture, a first substantially planar surface and a second surface including a planar portion;

said third metallized layer being formed on said first surface;

said fifth metallized layer being formed on said planar portion of said second surface;

said second ceramic layer being mounted on said first ceramic layer so that the central aperture of said first ceramic member is substantially aligned with the central aperture of said second ceramic member; and said cover means being attached to said third metallized layer so that said cover means covers said central aperture of said first and second ceramic members.

6. A device as claimed in claim 5 in which said second surface of said second ceramic member further includes a plurality of projections extending outward from said second surface; and said second ceramic member is mounted on said first ceramic member so that said projections are mounted above said external lead connecting regions of said first metallized layers.

* * * * *

UNITED STATES PATENT OFFICE
CERTIFICATE OF CORRECTION

Patent No. 3,893,193 Dated July 1, 1975

Inventor(s) Shinzo Anazawa, Seiichi Ueno and Isamu Nagasako

It is certified that error appears in the above-identified patent and that said Letters Patent are hereby corrected as shown below:

Claim 1, Col. 7, Line 26 - Before "ceramic" insert -- second --

Signed and Sealed this

*twenty-eight* Day of *October 1975*

[SEAL]

*Attest:*

RUTH C. MASON
*Attesting Officer*

C. MARSHALL DANN
*Commissioner of Patents and Trademarks*